US011297258B2

(12) United States Patent
Goma et al.

(10) Patent No.: US 11,297,258 B2
(45) Date of Patent: Apr. 5, 2022

(54) HIGH DYNAMIC RANGE SOLID STATE IMAGE SENSOR AND CAMERA SYSTEM

(71) Applicant: QUALCOMM Incorporated, San Diego, CA (US)

(72) Inventors: Sergiu Goma, San Diego, CA (US); Biay-Cheng Hseih, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/141,388

(22) Filed: Apr. 28, 2016

(65) Prior Publication Data
US 2017/0099422 A1 Apr. 6, 2017

Related U.S. Application Data

(60) Provisional application No. 62/236,033, filed on Oct. 1, 2015.

(51) Int. Cl.
*H04N 5/235* (2006.01)
*H04N 5/3745* (2011.01)
(Continued)

(52) U.S. Cl.
CPC ......... *H04N 5/2355* (2013.01); *H01L 27/146* (2013.01); *H01L 27/14609* (2013.01);
(Continued)

(58) Field of Classification Search
CPC .. H04N 5/378; H04N 5/35536; H04N 5/3745; H04N 5/35527; H04N 5/2355;
(Continued)

(56) References Cited

U.S. PATENT DOCUMENTS 5,471,515 A * 11/1995 Fossum ............... G11C 19/282
257/239
6,011,251 A * 1/2000 Dierickx ........... H01L 27/14643
250/208.1
(Continued)

FOREIGN PATENT DOCUMENTS

CN 104884972 A 9/2015
CN 204632761 U 9/2015
(Continued)

OTHER PUBLICATIONS

Brown M.G., et al., "Digital-pixel focal plane array development," International Society for Optics and Photonics, vol. 7608, 2010, pp. 76082H-1-76082H-10.
(Continued)

*Primary Examiner* — Chiawei Chen
(74) *Attorney, Agent, or Firm* — Qualcomm Incorporated

(57) ABSTRACT

A high dynamic range solid state image sensor and camera system are disclosed. In one aspect, the solid state image sensor includes a first wafer including an array of pixels, each of the pixels comprising a photosensor, and a second wafer including an array of readout circuits. Each of the readout circuits is configured to output a readout signal indicative of an amount of light received by a corresponding one of the pixels and each of the readout circuits includes a counter. Each of the counters is configured to increment in response to the corresponding photosensor receiving an amount of light that is greater than a photosensor threshold. Each of the readout circuits is configured to generate the readout signal based on a value stored in the corresponding counter and a remainder stored in the corresponding pixel.

30 Claims, 11 Drawing Sheets

(51) Int. Cl.
| | |
|---|---|
| H04N 5/355 | (2011.01) |
| H04N 5/369 | (2011.01) |
| H01L 27/146 | (2006.01) |
| H04N 5/376 | (2011.01) |
| H04N 5/378 | (2011.01) |

(52) U.S. Cl.
CPC .. *H01L 27/14634* (2013.01); *H01L 27/14636* (2013.01); *H04N 5/355* (2013.01); *H04N 5/35536* (2013.01); *H04N 5/369* (2013.01); *H04N 5/378* (2013.01); *H04N 5/379* (2018.08); *H04N 5/3765* (2013.01); *H04N 5/37455* (2013.01); *H01L 27/1464* (2013.01)

(58) Field of Classification Search
CPC .... H04N 5/37455; H04N 5/355; H04N 5/369; H04N 5/379; H01L 2224/16145; H01L 27/1464; H01L 31/02027; H01L 27/14609; H01L 27/14634; H01L 27/14632; H01L 27/14636; H01L 27/146
See application file for complete search history.

(56) References Cited

U.S. PATENT DOCUMENTS

| | | | | |
|---|---|---|---|---|
| 6,486,504 | B1* | 11/2002 | Guidash | H04N 5/35554 257/222 |
| 6,885,047 | B2* | 4/2005 | Shinohara | H01L 27/14609 257/233 |
| 7,453,131 | B2* | 11/2008 | Marshall | H01L 27/14609 257/438 |
| 8,508,637 | B2 | 8/2013 | Han et al. | |
| 8,637,800 | B2* | 1/2014 | Kozlowski | H01L 27/14634 250/208.1 |
| 9,406,561 | B2* | 8/2016 | Farooq | H01L 21/76898 |
| 9,491,383 | B2* | 11/2016 | Boisvert | H04N 5/378 |
| 9,521,337 | B1* | 12/2016 | Shen | H04N 5/3355 |
| 9,521,338 | B2* | 12/2016 | Vogelsang | H04N 5/3696 |
| 9,565,383 | B2* | 2/2017 | Sukegawa | H01L 25/167 |
| 9,621,829 | B1* | 4/2017 | Boemler | H04N 5/37455 |
| 9,622,650 | B2* | 4/2017 | Blanquart | A61B 1/00009 |
| 9,634,052 | B2* | 4/2017 | Sukegawa | H01L 27/14634 |
| 9,641,777 | B2* | 5/2017 | Sukegawa | H04N 5/3745 |
| 2003/0112352 | A1* | 6/2003 | Tanaka | H04N 5/3597 348/308 |
| 2005/0092894 | A1* | 5/2005 | Fossum | H01L 27/14609 250/208.1 |
| 2005/0167709 | A1* | 8/2005 | Augusto | H01L 27/14643 257/292 |
| 2006/0114342 | A1* | 6/2006 | Egawa | H04N 5/361 348/241 |
| 2006/0181627 | A1* | 8/2006 | Farrier | H01L 27/14603 348/308 |
| 2007/0194356 | A1* | 8/2007 | Moon | H01L 27/14625 257/291 |
| 2008/0316347 | A1 | 12/2008 | Gamal et al. | |
| 2009/0111244 | A1* | 4/2009 | Yamazaki | B23K 26/03 438/458 |
| 2009/0200478 | A1* | 8/2009 | Bethke | G01T 1/247 250/370.09 |
| 2010/0091153 | A1* | 4/2010 | Ogasawara | H04N 5/378 348/294 |
| 2010/0140732 | A1* | 6/2010 | Eminoglu | H01L 27/14634 257/447 |
| 2010/0245647 | A1* | 9/2010 | Honda | H01L 27/14634 348/308 |
| 2011/0074981 | A1 | 3/2011 | Border et al. | |
| 2012/0293698 | A1* | 11/2012 | Sukegawa | H01L 25/167 348/294 |
| 2013/0107093 | A1* | 5/2013 | Aoki | H04N 5/3745 348/302 |
| 2013/0308027 | A1* | 11/2013 | Jenkin | H04N 5/347 348/302 |
| 2013/0320194 | A1 | 12/2013 | Chen et al. | |
| 2014/0104452 | A1* | 4/2014 | Kim | H04N 5/23229 348/222.1 |
| 2014/0263959 | A1* | 9/2014 | Hsu | H01L 31/18 250/208.1 |
| 2014/0320718 | A1 | 10/2014 | Fan | |
| 2015/0189214 | A1* | 7/2015 | Kurose | H01L 25/18 250/208.1 |
| 2016/0099371 | A1 | 4/2016 | Webster et al. | |
| 2016/0342874 | A1* | 11/2016 | Powell | G06K 19/06037 |
| 2017/0131143 | A1* | 5/2017 | Andreou | G01J 1/44 |
| 2017/0208272 | A1* | 7/2017 | Guidash | H04N 5/3575 |
| 2017/0213866 | A1* | 7/2017 | Ni | H01L 27/14634 |
| 2017/0256666 | A1* | 9/2017 | Webster | H01L 31/1075 |
| 2017/0330912 | A1* | 11/2017 | Sukegawa | H01L 27/14634 |
| 2018/0124336 | A1* | 5/2018 | Jonas | H04N 5/378 |

FOREIGN PATENT DOCUMENTS

| | | |
|---|---|---|
| KR | 20060132445 A | 12/2006 |
| WO | WO-2008031089 A2 | 3/2008 |
| WO | WO-2014144391 A1 | 9/2014 |

OTHER PUBLICATIONS

Fernandez-Cull C., et al., "Simultaneous Dynamic Pupil Coding with On-chip Coded Aperture Temporal Imaging," Signal Recovery and Synthesis, Optical Society of America 2014, pp. 1-2.

Hirakawa K., et al., "Single-shot high dynamic range imaging with conventional camera hardware," Proceedings of International Conference on Computer Vision, 2011, pp. 1-8.

Nayar S.K., et al., "High dynamic range imaging: Spatially varying pixel exposures," Proceedings of IEEE Conference on Computer Vision and Pattern Recognition (CVPR), 2000, pp. 1-8, URL: http://www.cs.columbia.edu/CAVE/.

Tyrrell B., et al., "Time delay integration and in-pixel spatiotemporal filtering using a nanoscale digital CMOS focal plane readout," IEEE Transactions on Electron Devices, vol. 56, No. 11, Nov. 2009, pp. 2516-2523.

International Search Report and Written Opinion—PCT/US2016/050729—ISA/EPO—dated Oct. 20, 2016.

Horn S.B., et al., "Vertically Integrated Sensor Arrays: VISA", Proceedings of SPIE, IEEE, US, vol. 5406, Sep. 3, 2004 (Sep. 3, 2004), XP002587962, pp. 332-340.

* cited by examiner

HIGH DYNAMIC RANGE SOLID STATE IMAGE SENSOR AND CAMERA SYSTEM

INCORPORATION BY REFERENCE TO PRIORITY APPLICATION(S)

This application claims the benefit of U.S. Provisional Application No. 62/236,033, filed Oct. 1, 2015, which is hereby incorporated by reference in its entirety.

TECHNICAL FIELD

The systems and methods disclosed herein are directed to solid state image sensors, and more particularly to dynamic range extension.

BACKGROUND

Full well capacity is the largest charge a pixel can hold before saturation which results in degradation of the signal. When the charge in a pixel exceeds the saturation level, the charge starts to fill adjacent pixels, a process known as blooming. The sensor also starts to deviate from a linear response and hence compromises the quantitative performance of the camera.

Dynamic range is a measure of how well a sensor can measure an accurate signal at low light intensities all the way up until it reaches saturation, which may be related to full well capacity. The dynamic range of a camera in conventional sensors is typically defined as the full well capacity divided by the camera noise and relates to the ability of a camera to record simultaneously very low light signals alongside bright signals. Thus, for conventional sensors, given a similar noise floor, the dynamic range of a sensing element is proportional to its well capacity, which is typically proportional to the size of such light sensing elements. Larger pixels have greater full well capacity and accordingly higher dynamic range.

In digital imaging, the dynamic range of a complementary metal-oxide-semiconductor (CMOS) sensor may, at times, be insufficient to accurately represent outdoor scenes. This may be especially true in the more compact sensors which may be used in mobile devices, for example in the camera on a mobile telephone. For example, a typical sensor used in a mobile device camera may have a dynamic range of approximately 60-70 dB. However, a typical natural outdoor scene can easily cover a contrast range of 100 dB between light areas and shadows. Because this dynamic range is greater than the dynamic range of a typical sensor used in a mobile device, detail may be lost in images captured by mobile devices.

Further, the trend in digital cameras is toward smaller pixels to drive megapixel count upward or to enable smaller sensor areas, and smaller pixels can suffer from more limited full well capacity than larger pixels. Particularly in mobile sensors, the trend in pixel size is to shrink the pixel size and also sensor area and attempt to maintain performance through advanced processing or sensor architectures.

SUMMARY

The systems, methods and devices of this disclosure each have several innovative aspects, no single one of which is solely responsible for the desirable attributes disclosed herein.

In one aspect, there is provided a solid state image sensor, comprising a first wafer comprising an array of pixels, each of the pixels comprising a photosensor; and a second wafer comprising an array of readout circuits, each of the readout circuits being configured to output a readout signal indicative of an amount of light received by a corresponding one of the pixels, each of the readout circuits comprising a counter. Each of the counters is configured to increment in response to the corresponding photosensor receiving an amount of light that is greater than a photosensor threshold and each of the readout circuits is configured to generate the readout signal based on a value stored in the corresponding counter and a remainder stored in the corresponding pixel.

In another aspect, there is provided a method, operable by a solid state image sensor comprising a first wafer comprising an array of pixels, each of the pixels comprising a photosensor, and a second wafer comprising an array of readout circuits, each of the readout circuits comprising a counter, the method comprising: incrementing one of the counters in response to a corresponding one of the photosensors receiving an amount of light that is greater than a photosensor threshold; and generating, via the readout circuit, a readout signal indicative of an amount of light received by the corresponding photosensor within an exposure period, the readout signal being based on a value stored in the corresponding counter and a remainder stored in the corresponding pixel.

In yet another aspect, there is provided an apparatus comprising means for incrementing one of a plurality of counters in response to a corresponding one of a plurality of photosensors receiving an amount of light that is greater than a photosensor threshold, the pixels being formed on a first wafer of an image sensor; and means for generating a readout signal indicative of an amount of light received by a corresponding one of the photosensors within an exposure period, the readout signal being based on a value stored in the corresponding counter and a remainder stored in the corresponding pixel, the means for generating being located on a second wafer of the image sensor.

In still another aspect, there is provided a non-transitory computer readable storage medium having stored thereon instructions that, when executed, cause a processor circuit of a device to: increment one of a plurality of counters in response to a corresponding one of a plurality of photosensors receiving an amount of light that is greater than a photosensor threshold, the pixels being formed on a first wafer of an image sensor; and generate, via one of a plurality of readout circuit, a readout signal indicative of an amount of light received by a corresponding one of the photosensors within an exposure period, the readout signal being based on a value stored in the corresponding counter and a remainder stored in the corresponding pixel, the readout circuits being formed on a second wafer of the image sensor and each of the readout circuits comprising a corresponding one of the counters.

DETAILED DESCRIPTION

Embodiments of the disclosure relate to systems and techniques for increasing the dynamic range of solid state image sensors and related camera systems. The dynamic range of solid state imaging devices may be limited by the full well capacity of the pixels. In applications such as in mobile devices, where the pixel area is relatively small compared to other camera systems, there is not enough space on the wafer to implement digital circuitry for addressing this problem. Certain aspects of this disclosure relate to systems and techniques for stacking a pair of wafers together to allow maximum pixel area while providing sufficient space for additional circuitry, such as counters, which may enable sampling of each pixel multiple times within a given exposure.

The following detailed description is directed to certain specific embodiments. However, the described technology can be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Further, the systems and methods described herein may be implemented on a variety of different computing devices that host a camera. These include mobile phones, tablets, dedicated cameras, portable computers, photo booths or kiosks, personal digital assistants, ultra-mobile personal computers, mobile internet devices, security cameras, action cameras, drone cameras, automotive cameras, body cameras, head mounted cameras, etc. They may use general purpose or special purpose computing system environments or configurations. Examples of computing systems, environments, and/or configurations that may be suitable for use with the described technology include, but are not limited to, personal computers (PCs), server computers, hand-held or laptop devices, multiprocessor systems, microprocessor-based systems, programmable consumer electronics, network PCs, minicomputers, mainframe computers, distributed computing environments that include any of the above systems or devices, and the like.

Figure 1A:
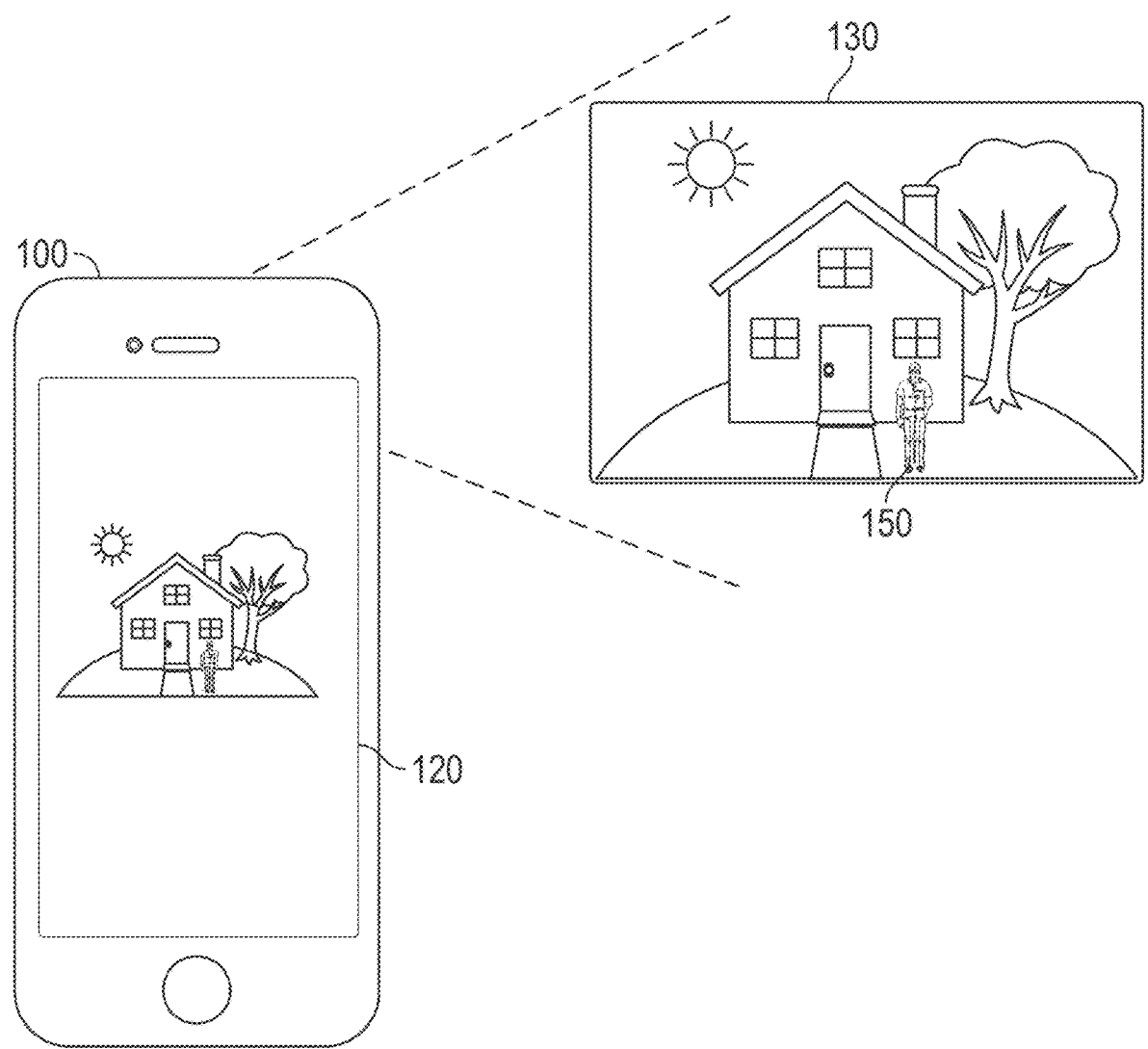
FIG. 1A illustrates an example of an apparatus (e.g., a mobile communication device) that includes an imaging system that can record images of a scene in accordance with aspects of this disclosure.

FIG. 1A illustrates an example of an apparatus (e.g., a mobile communication device) that includes an imaging system that can record images of a scene in accordance with aspects of this disclosure. The apparatus 100 includes a display 120. The apparatus 100 may also include a camera on the reverse side of the apparatus, which is not shown. The display 120 may display images captured within the field of view 130 of the camera. FIG. 1A shows an object 150 (e.g., a person) within the field of view 130 which may be captured by the camera. A processor within the apparatus 100 may perform calibration of a hybrid AF process based on the captured image of the scene.

The apparatus 100 may perform calibration of a hybrid AF process based on images captured by a user of the apparatus 100. In one aspect, the apparatus 100 may perform calibration based on images captured with hybrid AF processes performed during run-time (e.g., while in use by an end-user of the apparatus 100). Aspects of this disclosure may relate to techniques which can improve the calibration of the hybrid AF processes of the apparatus 100 compared to production line calibration.

Figure 1B:
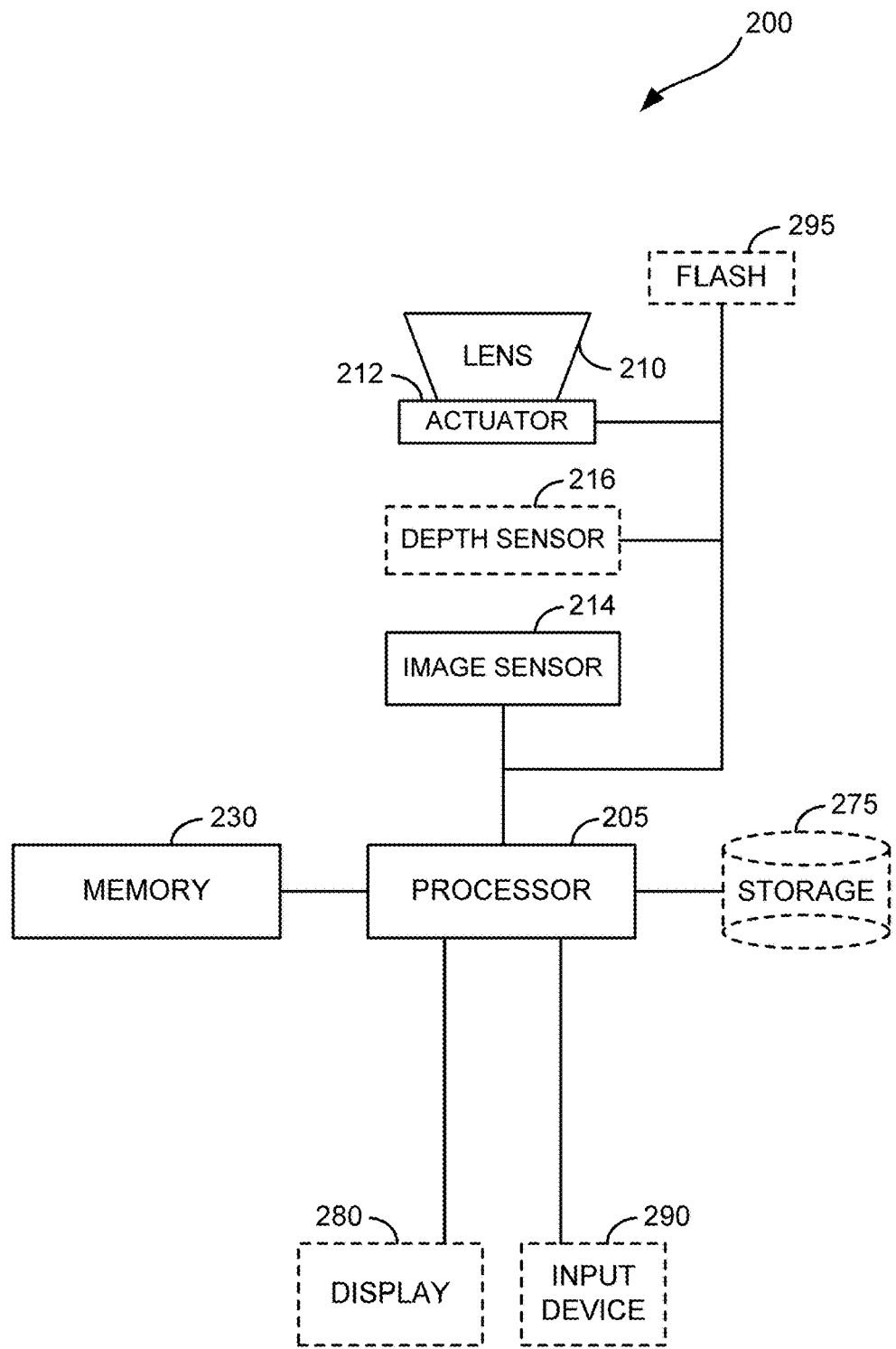
FIG. 1B is a block diagram illustrating an example of an imaging device in accordance with aspects of this disclosure.

FIG. 1B depicts a block diagram illustrating an example of an imaging device in accordance with aspects of this disclosure. The imaging device 200, also referred herein to interchangeably as a camera, may include a processor 205 operatively connected to an image sensor 214, an optional depth sensor 216, a lens 210, an actuator 212, a memory 230, an optional storage 275, an optional display 280, an optional input device 290, and an optional flash 295. In this example, the illustrated memory 230 may store instructions to configure processor 205 to perform functions relating to the imaging device 200. In this example, the memory 230 may include instructions for instructing the processor 205 to perform calibration of hybrid AF processes.

In an illustrative embodiment, light enters the lens 210 and is focused on the image sensor 214. In some embodiments, the lens 210 is part of a hybrid AF system which can include multiple lenses and adjustable optical elements and may be controllable by the processor 205. In one aspect, image sensor 214 utilizes a charge coupled device (CCD). In another aspect, the image sensor 214 utilizes either a complementary metal-oxide semiconductor (CMOS) or CCD sensor. The lens 210 is coupled to the actuator 212 and may be moved by the actuator 212 relative to the image sensor 214. The movement of the lens 210 with respect to the image sensor 214 may affect the focus of a captured image. The actuator 212 is configured to move the lens 210 in a series of one or more lens movements during an AF operation, for example, adjusting the lens position to change the focus of an image. When the lens 210 reaches a boundary of its movement range, the lens 210 or actuator 212 may be referred to as saturated. In an illustrative embodiment, the actuator 212 is an open-loop voice coil motor (VCM) actuator. However, the lens 210 may be actuated by any method known in the art including closed-loop VCM, Micro-Electronic Mechanical System (MEMS), shape memory alloy (SMA), piezo-electric (PE), or liquid lens.

The depth sensor 216 is configured to estimate the depth of an object to be captured in an image by the imaging device 200. The depth sensor 216 may be configured to perform a depth estimation using any technique applicable to determining or estimating depth of an object or scene with respect to the imaging device 200, including AF techniques for estimating depth such as TOFAF, laser auto focus, or DCIAF, or other depth sensing technologies such as structured light sensors. Alternatively, the depth sensor 216 may be configured to perform a depth estimation based on a lens position determined by PDAF. The techniques may also be applied using depth or location information received by the imaging device 200 from or about an object within a scene. Depending on the AF technique employed, the depth sensor 216 may be integrated into other components of the imaging device 200. For example, when using PDAF, the image sensor 214 may include specialized phase detection pixels which may be partially masked. These phase detection pixels may be formed as pairs referred to as "left" and "right" phase detection pixels.

The display 280 is configured to display images captured via the lens 210 and the image sensor 214 and may also be utilized to implement configuration functions of the imaging device 200. In one implementation, the display 280 may be configured to display one or more regions of a captured image selected by a user, via an input device 290, of the imaging device 200. In some embodiments, the imaging device 200 may not include the display 280.

The input device 290 may take on many forms depending on the implementation. In some implementations, the input device 290 may be integrated with the display 280 so as to form a touch screen display. In other implementations, the input device 290 may include separate keys or buttons on the imaging device 200. These keys or buttons may provide input for navigation of a menu that is displayed on the display 280. In other implementations, the input device 290 may be an input port. For example, the input device 290 may provide for operative coupling of another device to the imaging device 200. The imaging device 200 may then receive input from an attached keyboard or mouse via the input device 290. In still other embodiments, the input device 290 may be remote from and communicate with the imaging device 200 over a communication network, e.g., a wireless network.

The memory 230 may be utilized by the processor 205 to store data dynamically created during operation of the imaging device 200. In some instances, the memory 230 may include a separate working memory in which to store the dynamically created data. For example, instructions stored in the memory 230 may be stored in the working memory when executed by the processor 205. The working memory may also store dynamic run time data, such as stack or heap data utilized by programs executing on processor 205. The storage 275 may be utilized to store data created by the imaging device 200. For example, images captured via image sensor 214 may be stored on storage 275. Like the input device 290, the storage 275 may also be located remotely, i.e., not integral with the imaging device 200, and may receive captured images via the communication network.

Figure 4:
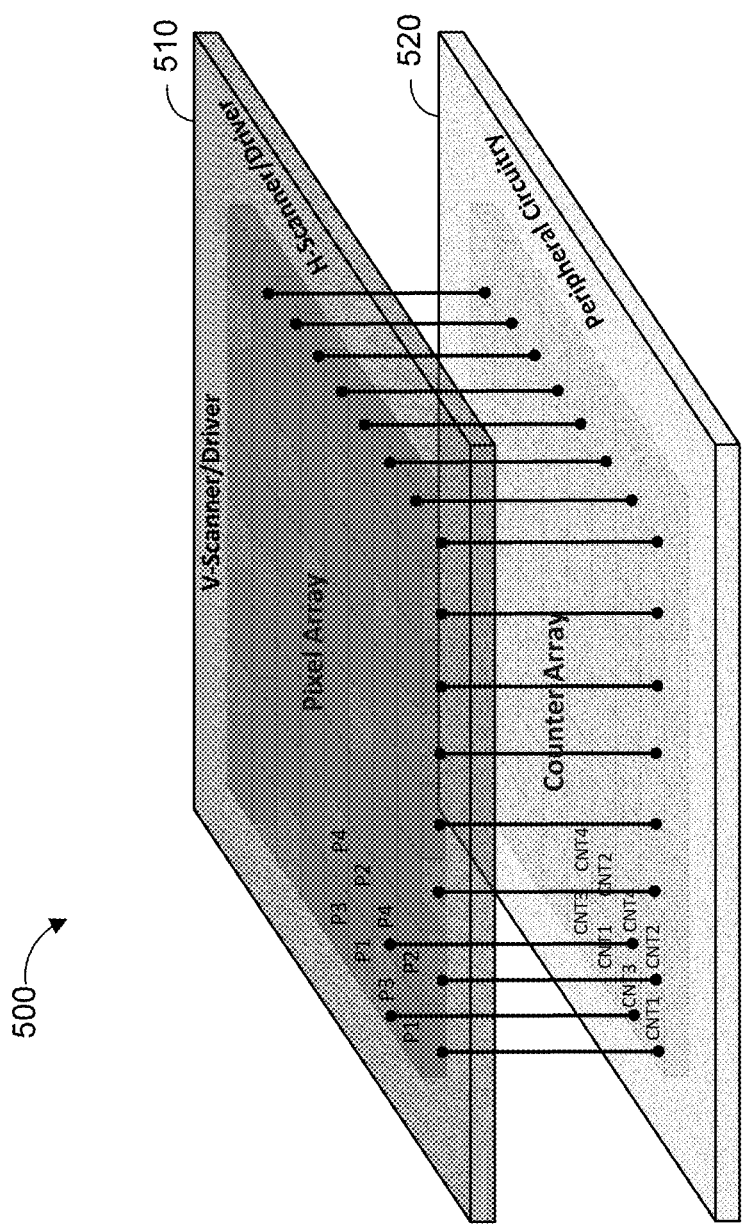
FIG. 4 illustrates a 3-dimensional (3D) view of the top and bottom wafers in accordance with aspects of this disclosure.
Figure 7:
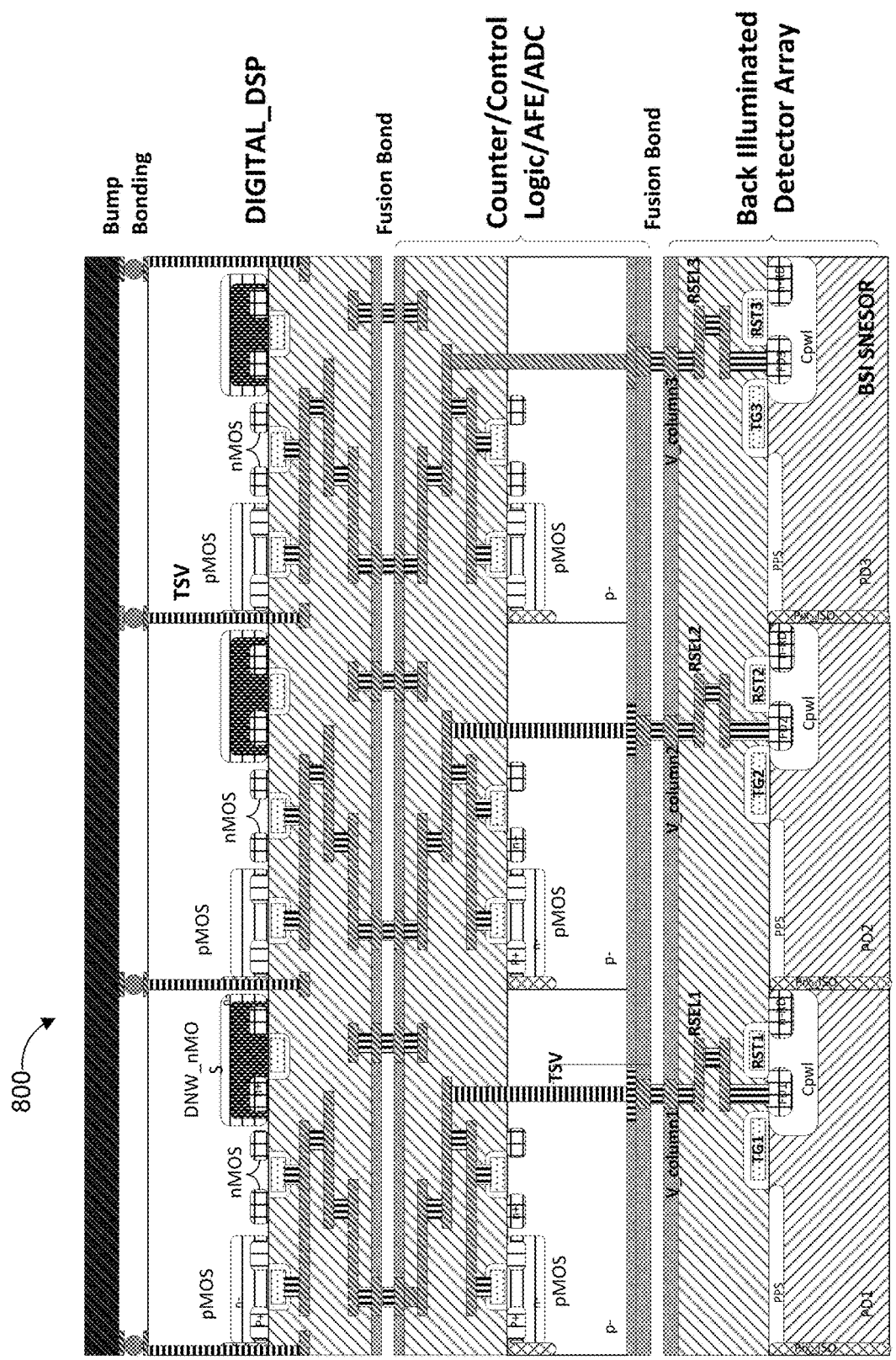
FIG. 7 illustrates yet another embodiment of the solid state image sensor in accordance with aspects of this disclosure.
Figure 8:
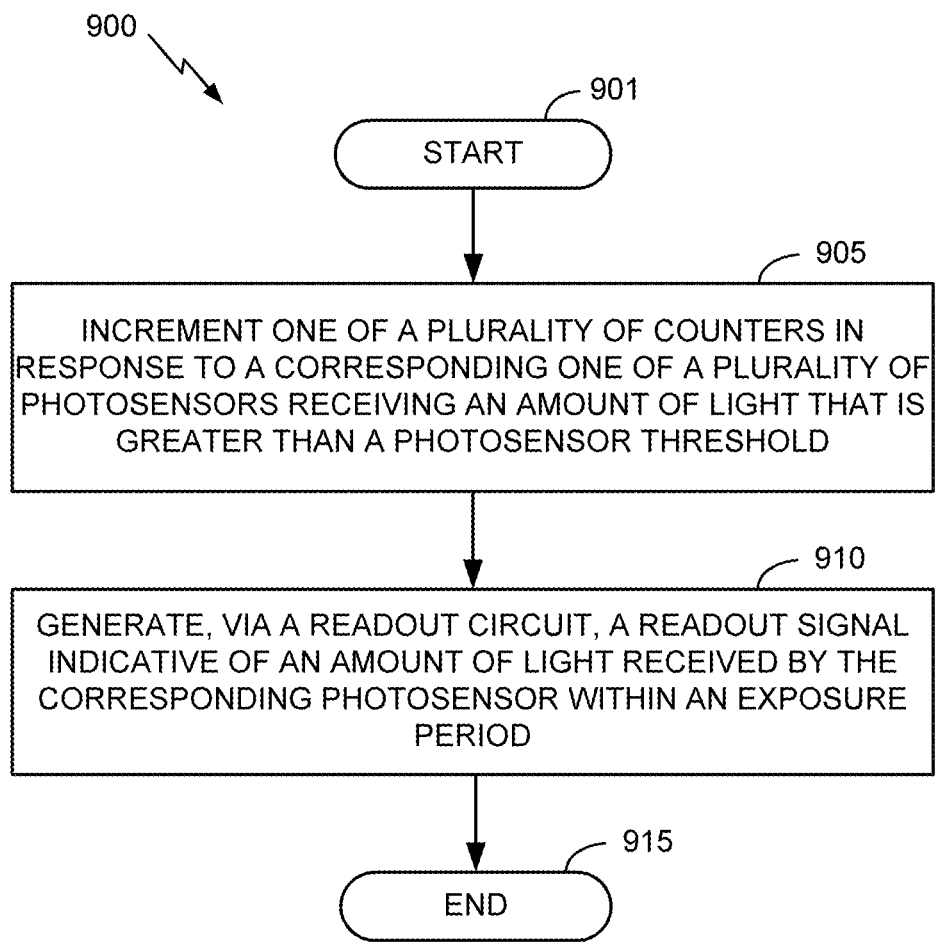
FIG. 8 is a flowchart illustrating a method for capturing an image using a solid state image sensor in accordance with aspects described in this disclosure.

The memory 230 may be considered a computer readable medium and stores instructions for instructing the processor 205 to perform various functions in accordance with this disclosure. For example, in some aspects, memory 230 may be configured to store instructions that cause the processor 205 to perform method 500, method 800, method 900, or portion(s) thereof, as described below and as illustrated in FIGS. 4, 7 and 8.

In one implementation, the instructions stored in the memory 230 may include instructions that, when executed, cause the processor 205 to determine lens positions in a range of lens positions of the lens 210 that may include a desired lens position for capturing an image. The determined lens positions may not include every possible lens position within a range of lens positions, but may include only a subset of the possible lens positions within the range of lens positions. The determined lens positions may be separated by a step size of one or more possible lens positions between determined lens positions. For example, the determined lens positions can include a first lens position at one end of the range of lens positions, the first lens position representing a first focusing distance, and a second lens position at the other end of the range of lens positions, the second lens position representing a second focusing distance. The determined lens positions may further include one or more intermediate lens positions, each intermediate lens position representing a focusing distance between the first and second focusing distances, where the determined lens positions are separated by a step size of one or more possible lens positions between the determined lens positions in the first range of lens positions. In an illustrative embodiment, the processor 205 may determine lens positions in a range of lens positions based at least in part on an estimation of the depth of an object.

The instructions may also, when executed, cause the processor 205 to determine or generate focus values for images captured at one or more lens positions within the range of lens positions. The desired lens position for capturing an image may be a lens position having a maximum focus value. The instructions may also, when executed, cause the processor 205 to determine or generate a focus value curve or data representative of a focus value curve based on the determined or generated focus values. The instructions may also, when executed, cause the processer 205 to determine lens positions in a search range of lens positions based at least in part on generated focus values or a focus value curve or data representative of a focus value curve based on a previous search range of lens positions.

Overview of Example Pixel Readout Architectures

Figure 2A:
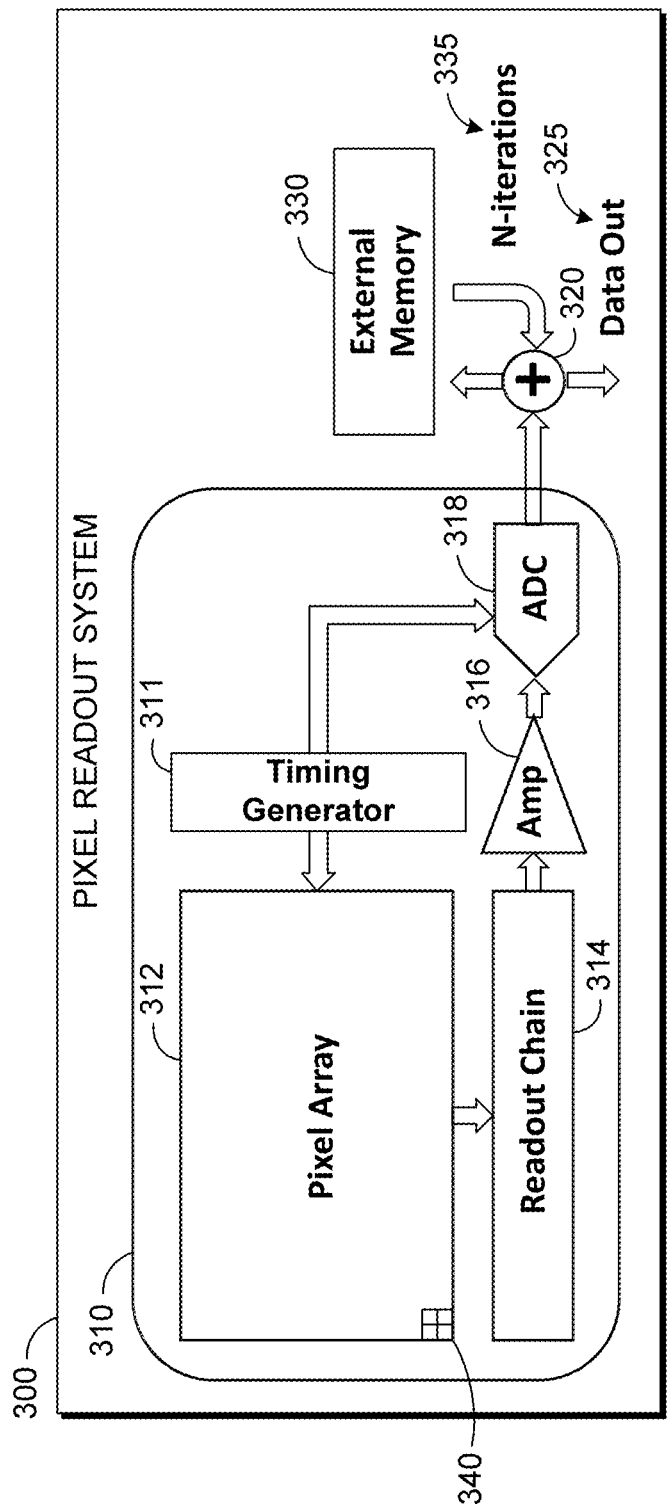
FIG. 2A illustrates an embodiment of a pixel readout system in accordance with aspects of this disclosure.

FIG. 2A illustrates an embodiment of a pixel readout system 300 including a set of analog components 310 including a (sensor) pixel array 312, readout circuitry 314 (also referred to as a "readout chain"), an amplifier 316, and an analog-to-digital converter (ADC) 318. The pixel readout system 300 further includes timing circuitry 311 (also referred to as a "timing generator," which may be a digital component even though FIG. 2A illustrates the timing circuitry 311 as being included in the analog components 310). The analog components 310 are coupled via a bus 320 to a memory 330. Though not illustrated, the bus 320 can enable communication with other components, for example, with an image signal processor, a device memory, and/or readout control circuitry.

The pixel readout system 300 may be used for any CMOS, charge-coupled device (CCD), or other image sensor. In some embodiments, the sensor can be, for example, a 32 megapixel (MP)/30 frames per second (fps) image sensor having approximately 0.5 µm pixels, each having an approximate 1000 electron (−e) full well capacity. The image sensor may be designed to have 10 bit (b)/240-fps readout speed. Some implementations of the image sensor may have a digitally integrated design with an 8-frame accumulation shutter speed, for example, implementing an interleaved rolling shutter with no need to store a full frame. In one example, data may be output from the external memory 330, which may be for example a dynamic random-access memory (DRAM), at speeds of approximately 12 b/30-fps. Such an image sensor may result in an equivalent pixel full well capacity multiplied by a factor of eight, for example reaching approximately 8000-e full well capacity per pixel. These image sensor specifications represent just one embodiment of an image sensor using the pixel readout system 300, and other image sensors with varying specifications may be used in other embodiments.

The pixel array 312 may include a plurality of pixels 340 arranged in a predetermined number of rows and columns (e.g., M rows and N columns). Each pixel 340 may represents a single photoelectric charge detecting element of the pixel array 312. Each of the pixels may each include a photosensitive element, for example a photogate, photoconductor, photodiode, or other photodetector, overlying a substrate for accumulating photo-generated charge in an underlying portion of the substrate. The pixel array 312 may, in some implementations, include one or more filters positioned to filter incoming light, for example, an infrared cut-off filter or a color filter. The photosensitive element of a CMOS pixel may be one of a depleted p-n junction photodiode or a field-induced depletion region beneath a photogate.

Timing generator 311 may provide timing signals for reading out values representing the amount of light accumulated in each of the pixels (which may be referred to as a pixel value) of the pixel array 312. For example, timing generator 311 may include a column and row driver, where a combination of signals output from the column and row drivers may be able to individually select a pixel from the pixel array in order to read out the corresponding pixel value. The timing generator 311 may include control logic for controlling reset operations, exposure time, line time, and pixel time for the pixels 340 of the pixel array 312 and may also provide timing signals to the ADC 318. Readout circuitry 314 may include circuitry for reading out the pixel values from each of the pixels 340 in the pixel array 312. For example, readout circuitry 314 may include a plurality of row and column lines provided for the entire array 312. The column and row lines of the readout circuitry 314 may be electronically connected to column sample and hold (S/H) circuitry and row control circuitry, respectively, that operate according to the timing provided by the timing generator 311. In operation, the pixels 340 of each row in the pixel array 312 may be turned on at the same time by a row select line and the pixels of each column may be selectively output by a column select line.

After passing through the pixel circuitry, pixel signals are passed through the amplifier 316 to increase the strength of the pixel value (e.g., the voltage or current). As a summary, the timing generator 311, pixel array 312, readout circuitry 314, and amplifier 316 together may perform functions including: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge.

The amplified pixel signal is passed through ADC 318 before being output from the analog components 310. After the pixel value are read as analog signals in the analog components 310, the pixel values may be converted into digital signals to be read and processed by digital circuits, since digital circuits can offer advantages compared to analog circuits with respect to processing speed and efficient transmission of information. Thus, in at least one implementation, the ADC 318 converts the analog pixel value signals into suitable digital signals, for example into corresponding digital pixel values. The ADC 318 may convert an accumulated charge from the storage capacitor into a corresponding digital pixel value.

Figure 2B:
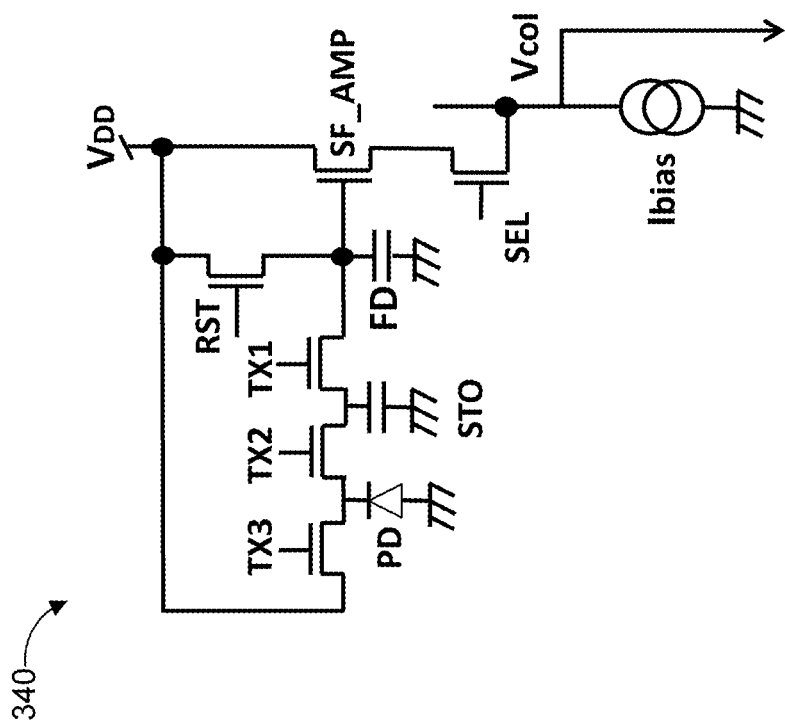
FIG. 2B illustrates one embodiment of the pixel circuitry for one pixel of the pixel readout system of FIG. 2A.

FIG. 2B illustrates one embodiment of the pixel circuitry 340 for one pixel of the pixel readout system 300 of FIG. 2A. Many such pixels 340 are arranged in the array 312, for example, forming rows and columns. For the sake of clarity, only one pixel 340 is illustrated in greater detail. The readout circuitry embodiment of FIG. 2B may perform both low noise and lag free charge transfer as well as snap shot features, e.g., frame storage and charge sink. In addition, the storage capacitor STO offers extended full well capacity for the pixel.

Each pixel 340 includes circuitry for reading the charge collected in the corresponding pixel 340. In one implementation, the pixel circuitry is connected to a corresponding one of the pixels 340 and includes an output field effect transistor formed in the substrate and a charge transfer section formed on the substrate adjacent the pixel 340. The pixel 340 may include a sensing node, for example, a floating diffusion node, connected to the gate of an output transistor. The floating diffusion node may be a region in active silicon that is electrically isolated from all other nodes of the readout circuitry (for example, when charge is being stored) and the potential of the floating diffusion node may be determined by the amount of charge stored in the floating diffusion node and the floating diffusion node's capacitance. The capacitance of the floating diffusion node may be lower than a threshold capacitance in order to achieve an adequately high conversion gain. The charge transfer section of the pixel circuitry may include at least one electronic component, for example a transistor, for transferring charge from the underlying portion of the substrate to the floating diffusion node and another electronic component, for example a reset transistor for resetting the node to a predetermined charge level prior to charge transference. Photo charge may be amplified when it moves from the initial charge accumulation region to the floating diffusion node, and the charge at the floating diffusion node may be converted to a pixel output voltage by a source follower output transistor SF_AMP. As discussed in more detail below, the pixel circuitry may further include a storage capacitor STO or other electronic charge storage device for storing multiple charge dumps from a pixel or pixels in the analog domain. The storage capacitor STO may be positioned beyond the floating diffusion node in the pixel circuitry (relative to the position of the pixel 340) in some embodiments, and may have a capacitance greater than that of the floating diffusion node. The storage capacitor STO may be on the same sensor chip or in the bottom chip of a stack-die with pixel-to-pixel connection in various embodiments.

The pixel circuitry includes a photodiode PD for accumulating photo-generated charge. Although the following description may refer specifically to a photodiode PD, those skilled in the art would recognize that other photosensors may be used in place of the photodiode without departing from this disclosure. Charge collected in the photodiode PD may be passed through a transfer transistor TX2 to the storage capacitor STO, and the storage capacitor STO may have an effective capacitance large enough to store multiple charge dumps from the photodiode PD, for example, eight or more charge dumps. The accumulated charge from the storage capacitor STO may be passed through another transfer transistor TX1 to the floating diffusion node of the floating diffusion capacitor FD. The selector transistor SEL allows a single row of the pixel array to be read by the image sensor. The source follower transistor SF_AMP converts the input applied from the floating diffusion node into an output signal (e.g., a voltage or current) which may be sensed at the output node Vcol. Accordingly, the source follower transistor SF_AMP is a drive transistor which forms a part of a source following amplifier and converts the detected image charge into a corresponding electrical signal.

The reset transistor RST acts as a switch to reset the floating diffusion capacitor FD. When the reset transistor RST is turned on, the floating diffusion transistor is effectively connected to the power supply, clearing all charge stored thereon. The pixel is reset when the reset transistor RST and transfer transistor TX3 are turned on simultaneously, setting both the floating diffusion capacitor FD and the photodiode PD to the VDD voltage level. Turning on either of transfer transistors TX2 or TX1 may set the storage capacitor STO to the VDD voltage level as well. When the transfer transistor TX3 is turned off, disconnecting the photodiode and floating diffusion transistor RF, the photodiode PD may to integrate received light into charge. In addition, the transfer transistor TX3 may serve as an overflow gate for blooming protection control as well as enabling snap shot features (e.g., frame storage & charge sink), providing electronic global shuttering operation so as to freeze fast action.

In one example, to implement a kTC noise reduction technique, first, the reset transistor RST is turned on and off to reset the floating diffusion capacitor FD. A signal measurement of the reset level is sampled from the floating diffusion node and stored, for example, on a column circuit. Next, the transfer transistor TX1 is turned on and off which allows charge on the photodiode to transfer to the floating diffusion capacitor FD. Once the charge transfer is complete, this charge (the photodiode signal level plus the floating diffusion reset level) is measured and stored on the column circuit as well. These two stored voltages are then differenced to determine the photodiode signal level, reducing kTC noise.

Overview of Limitations of Certain Solid State Image Sensor Architectures

An image of a scene which may be captured by camera systems may have a wide range of illumination, having intensities that may vary over 100 dB or more. Biological visual systems, such as human visual systems, are sensitive to these types of high illumination variation in scenes. High dynamic range scenes may include such scenes having illumination intensities that vary over 100 dB. One technology that may be sensitive to this range of illumination intensity includes silver halide film.

Various grades of solid state image sensors may have workable illumination sensitivity ranges. For example, high end CCDs may have an illumination sensitivity of greater than 78 dB, consumer grade CCDs may have an illumination sensitivity of about 66 dB, and consumer grade CMOS imagers may have an illumination sensitivity of about 60 dB. Accordingly, with the exception of certain high end CCDs, solid state image sensors generally do not have a dynamic range that is high enough to capture high dynamic range scenes. An example of a dynamic range which may be sufficient for accurately capturing high dynamic range scenes is, for example, an illumination sensitivity of greater than 100 dB at 12-bit depth.

Methods and Architectures for Extending Dynamic Range

A number of methods and architectures exist for extending the dynamic range of an image captured from a scene. In order to increase dynamic range, the maximum detectable photo current may be increased and/or the minimum detectable photo current may be decreased. One method for achieving these goals is to spatially alter the pixel integration times based on scene illumination. For example, high illumination scenes or regions may be captured with shortened integration times, while low illumination scenes or regions may be captured with lengthened integration times. However, extending the integration time may lead to certain visual defects such as saturation or motion blur.

Another technique for increasing dynamic range is adjusting well capacity, which increases noise, leading to a lower signal-to-noise ratio and/or a nonlinear sensor response. Yet another technique for increasing dynamic range is multiple (image) capture. Multiple capture requires a high-speed, non-destructive readout, on-chip memory, and logic to perform reconstruction of a high dynamic range image. Still another technique for increasing dynamic range is spatially varying exposure, which has a good linearity. Spatially varying expose may include correlated double sampling (CDS) noise suppression, which may require a comparatively high-resolution imager since the spatial resolution is reduced in CDS processing.

Additionally, certain image sensors may be used for increasing dynamic range. For example, logarithmic sensors may be used, which may produce fixed-pattern noise (FPN) due to the large variation in subthreshold metal-oxide-semiconductor FET (MOSFET) characteristics. Logarithmic sensors also have a nonlinear response, and CDS noise suppression cannot be used, resulting in a poor signal-to-noise ratio. Another image sensor which has been used is a local adaptation sensor. Local adaptation sensors also cannot use CDS noise suppression, have a nonlinear response, poor signal-to-noise ratio, and a poor pixel complexity.

Figure 3A:
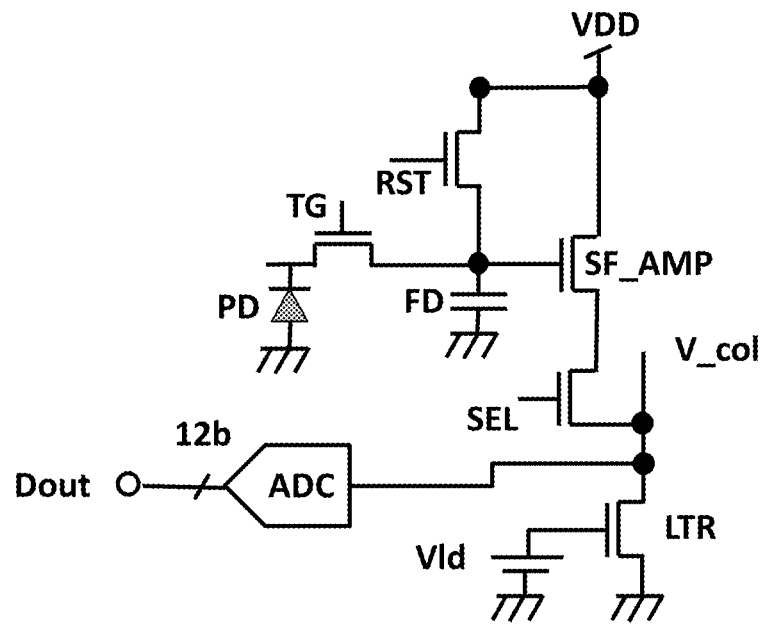
FIG. 3A illustrates a high dynamic solid state image sensor according to certain aspects of this disclosure.
Figure 3B:
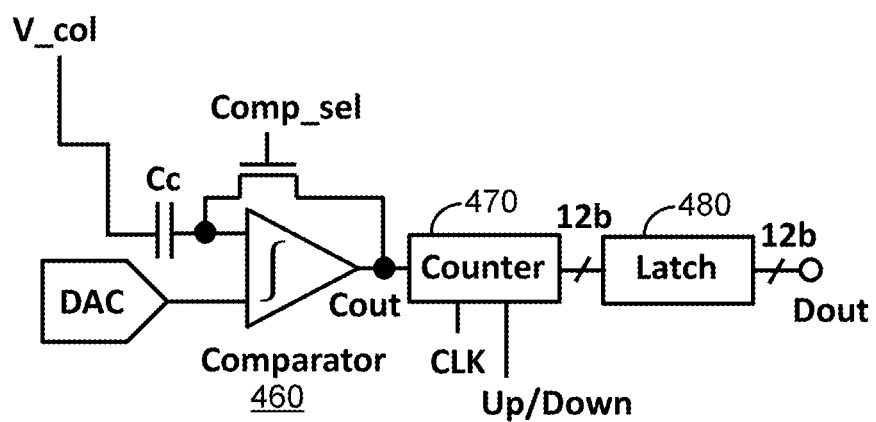
FIG. 3B illustrates a readout circuit according to certain aspects of this disclosure.

FIGS. 3A and 3B illustrate a high dynamic range solid state image sensor according to certain aspects of this disclosure. Specifically, the image sensor illustrated in FIGS. 3A and 3B may have a high speed and a high resolution image sensor readout chain with column parallel 12-bit ADC. As discussed below, this can be used to extend bit-depth up to, for example, 24-bit data output by adding a modulo counter (MOD-N counter), for example, a 4-bit ripple counter is called a MOD-16 counter.

Figure 3C:
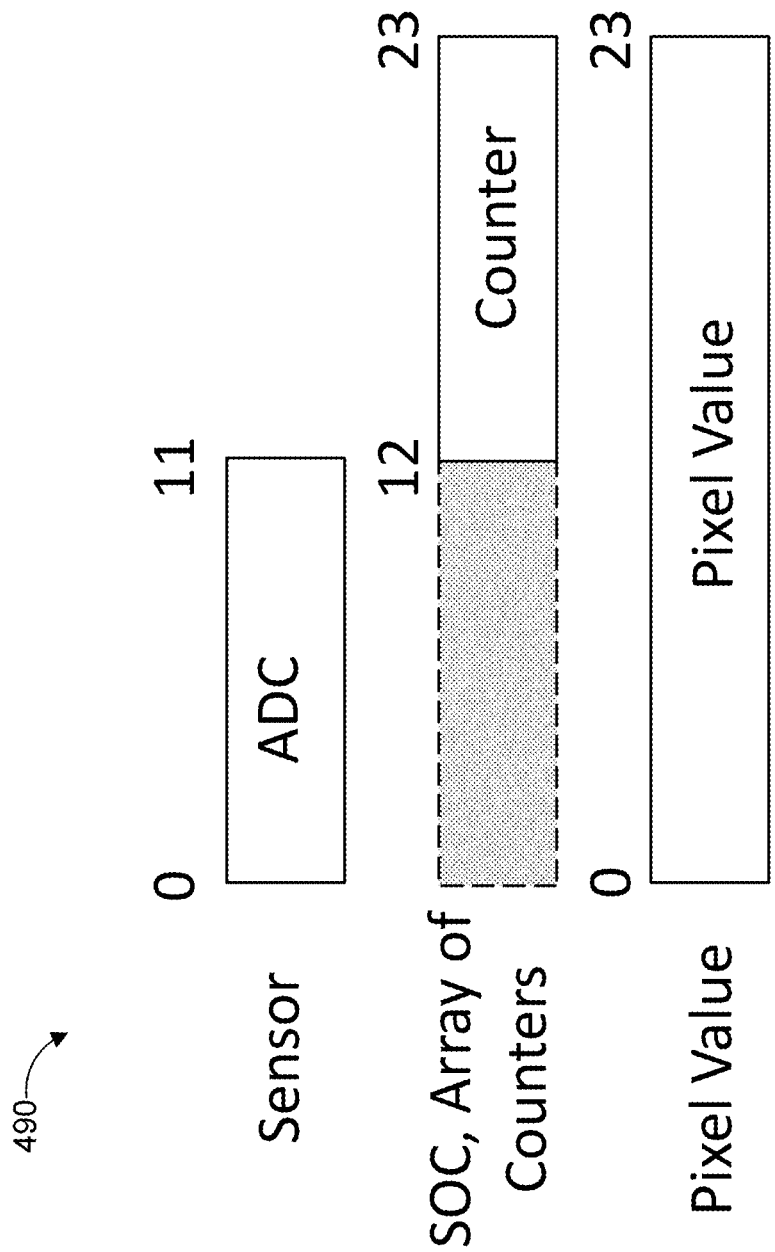
FIG. 3C illustrates the combination of inputs used to generate a pixel value according to certain aspects of this disclosure.

Stack technology allows for a pair of wafers, each having circuity formed thereon, to be electrically connected together. Certain aspects of this disclosure take advantage of stack technology with a pixel level interconnection between a pair of wafers. In one example, a sensor including an array of pixels formed on a first wafer (for example, a top wafer or die) is combined with an array of counters formed on a second wafer (for example, a bottom wafer or die). In certain implementations, the sensor wafer (e.g., the top die) may output the least significant bits of a pixel value for a pixel in a given exposure and the counter wafer (bottom die) may output the most significant bits of the pixel value. In detail, the counter for a given pixel may count the number of times that the charge integrated from light received at a corresponding pixel meets or exceeds a threshold value (e.g., a photosensor threshold) for a given exposure. A visual representation of the combination of least and most significant bits is shown in FIG. 3C, which will be described in greater detail below. In one implementation, a pixel on the top die may provide the 12 least significant bits and a corresponding counter on the bottom die may provide the 12 most significant bits for a given exposure.

FIG. 3A illustrates a high dynamic solid state image sensor according to certain aspects of this disclosure. FIG. 3B illustrates a readout circuit according to certain aspects of this disclosure. The pixel 440 illustrated in FIG. 3A includes a photodiode PD, a transfer transistor TG, a floating diffusion capacitor FD, a reset transistor RST, a voltage VDD, a source follower transistor SF_AMP, a select transistor SEL, an output node V_col, an analog-to-digital converter ADC, a voltage generator Vld, a load transistor LTR, and a least significant bits digital output Dout. The readout circuit of FIG. 3B includes an input node V_col, a charge coupling capacitor Cc, a digital-to-analog converter DAC, a comparator select transistor Comp_sel, a comparator 460, a counter 470, a latch 480, and a most significant bits digital output Dout. The counter 470 may receive clock and up/down (or a reset) inputs.

In one implementation, the circuit diagram of the pixel 440 shown in FIG. 3A may be included on the top wafer and the readout circuit 450 illustrated in FIG. 3B may be included on the bottom wafer. The division of certain elements illustrated in FIGS. 3A and 3B between the top and bottom wafers may be selected based on the design requirements of the image sensor. As such, the division of certain elements between FIGS. 3A and 3B are merely exemplary and may be altered based on various design considerations. For example, in one implementation, analog components for the image sensor are formed on the top wafer, while the remaining components, including the pixel addressing lines, are formed on the bottom wafer. By including as many components as possible on the bottom wafer, the size of the aperture for each pixel may be increased since there is no need to reserve space for additional components. Furthermore, various components may be removed or added to the implementation illustrated in FIGS. 3A and 3B without departing from the aspects of this disclosure.

With reference to FIG. 3A, the pixel 440 may include a photodiode PD which integrates received light and transforms the received light into electrical charge. The amount of charge collected by the photodiode PD may be proportional to the intensity of the light that is received at the photodiode PD. The charge accumulated from the photodiode PD may be transferred via the transfer transistor TG to the floating diffusion capacitor FD. The charge stored on the floating diffusion capacitor FD may then be amplified through the source follower transistor SF_AMP and applied to the output node V_col when the selector transistor SEL is turned on. As such, the output node V_col may output a value (e.g., charge, voltage, current, etc.) that is indicative of the amount of light received by the photodiode PD of the pixel 440. As in the implementation of FIG. 2, the floating diffusion capacitor FD may be reset to the voltage VDD via the reset transistor RST and the photodiode may be reset to the voltage VDD via the reset transistor RST and the transfer transistor TG.

In the implementation of FIG. 3A, the least significant bits of the pixel value may be directly read out by converting the analog signal at the output node V_col into a digital signal via the analog-to-digital converter ADC. The least significant bits may then be output via the output Dout. While various numbers of bits may be used to represent the least significant bits of the pixel value, FIG. 3A illustrates an embodiment having 12 bits. The pixel further includes a voltage generator Vld and a load transistor LTR. The load transistor PTR may be a load transistor of the source follower output transistor SF_AMP. The voltage generator Vld is a bias voltage supply with biases the gate of the load transistor LTR.

Referring now to the readout circuit 450 of FIG. 3B, the input node V_col may be connected to the output node V_col of the pixel 440 of FIG. 3A to receive the analog output therefrom. The analog output received by the input node V_col may be stored in the charge coupling capacitor Cc. The digital-to-analog converter DAC may convert a digital photodiode threshold value (also referred to as a photosensor threshold) into an analog value to be supplied to the comparator 460. However, in other implementations, an analog photodiode threshold value may be directly supplied to the comparator 460 without the use of a digital-to-analog converter DAC. In certain implementations, the photodiode threshold value may be based on the amount of charge required to saturate the photodiode PD. For example, the photodiode threshold may be selected such that the photodiode PD is reset in response to the counter 470 being incremented and prior to the photodiode PD being saturated. The comparator select transistor Comp_sel initiates a comparison of the analog signal stored in the charge coupling capacitor and the photodiode threshold value by the comparator 460.

With reference to FIGS. 3A and 3B, in one implementation, the analog-to-digital converter ADC and digital-to-analog converter DAC may each include a plurality of parallel banks of comparators and counters. The column of comparators in the digital-to-analog converter DAC may be driving by a ramp generator and the pixel output received from the analog-to-digital converter ADC via the series-connected charge coupling capacitor Cc. In at least one implementation, the counter 470, which may include a plurality of column counters implemented as ripple counters, may count the number of clock cycles that occur until the output of the comparator 460 changes.

The comparator 460 outputs a value indicative of whether the analog signal stored in the charge coupling capacitor is greater than the photodiode threshold value. As discussed above, the counter 470 increments for each clock cycle that occurs until the analog signal stored in the charge coupling capacitor is greater than the photodiode threshold value. In other implementations, the output Cout of the comparator 470 may indicate whether the analog signal stored in the charge coupling capacitor is greater than or equal to the photodiode threshold value. Since the counter 470 is incremented based on the value of the input node V_col received from the pixel 440, the counter 470 is incremented in response to the corresponding photodiode PD receiving an amount of light that is greater than a threshold value that is proportional to the photodiode threshold value. The latch 480 may store the value of the counter 470 at the end of each exposure period such that the value may be read out by a readout chain 314 (see FIG. 2A) at a later time.

Although not illustrated, there may be a feedback loop between the output Cout of the comparator 460 and each of the reset transistor RST and the transfer transistor TG. As such, when the output V_vol of the pixel 440 is greater than the photodiode threshold value, each of the photodiode PD and the floating diffusion capacitor FD may be reset to the voltage VDD. The cycle of incrementing the counter 470 and resetting each of the photodiode PD and the floating diffusion capacitor FD may occur multiple times within a given exposure period. Thus, the value stored by the counter 470 may be indicative of the number of times that the photodiode has been reset (e.g., the number of times that the output V_col of the pixel 440 has exceeded the photodiode threshold).

The overall pixel value generated by the pixel 440 and the readout circuit 450 is shown by the diagram 490 illustrated in FIG. 3C. The least significant bits (e.g., bits 0 to 11) of the pixel value may be represented by the output of the Dout of the analog-to-digital converter ADC of the pixel 440 at the end of each exposure period. Thus, once the counter 470 has been incremented over the course of the exposure period, the remaining output V_col, or remainder, is used to generate the least significant bits of the pixel value. The output Dout of the latch 480 (e.g., the output of the counter 470 at the end of the exposure period) may be representative of the most significant bits (e.g., bits 12-23) of the pixel value. Thus, a combination of the digital outputs of the pixel 440 and the readout circuit 450 may indicate the pixel value of light received by the pixel over the exposure period.

In greater detail, for a given exposure, if the dynamic range of the pixel 440 is less than the dynamic range of the scene to be captured by the pixel 440, the pixel 440 will saturate. In order to prevent the pixel 440 from saturating, each time the pixel 440 exceeds a photodiode threshold, the counter 470 will be incremented and exposure of the pixel 440 will be restarted by resetting the photodiode PD and the floating diffusion capacitor FD. For the last time that a pixel 440 is reset within the given exposure, the pixel 440 will record a remainder value as the least significant bits. A full pixel value is then read by taking the remainder value simultaneously from the pixel's 440 ADC and along with the value of the corresponding counter 470 via the latch 480. The remainder value and the counter value may then be combined as an integer and fraction value to form the overall value detected by the pixel 440.

FIG. 4 illustrates a 3-dimensional (3D) view of the top and bottom wafers of an image sensor in accordance with aspects of this disclosure. Each of the pixels in the top wafer 510 may be electrically connected to a corresponding counter circuit in the bottom wafer 520. FIG. 4 illustrates a number of pixels P1 to P4 formed on the top wafer 510 and a plurality of counter circuits/logic CNT1 to CNT4 formed on the bottom wafer 520. The top wafer 510 may further include vertical and horizontal scanners or drivers which may select the various pixels P1 to P4 of the array. Similarly, the bottom wafer 520 may include peripheral circuitry used to read out the output values from the counters of the counter circuits/logic CNT1 to CNT4.

Figure 5:
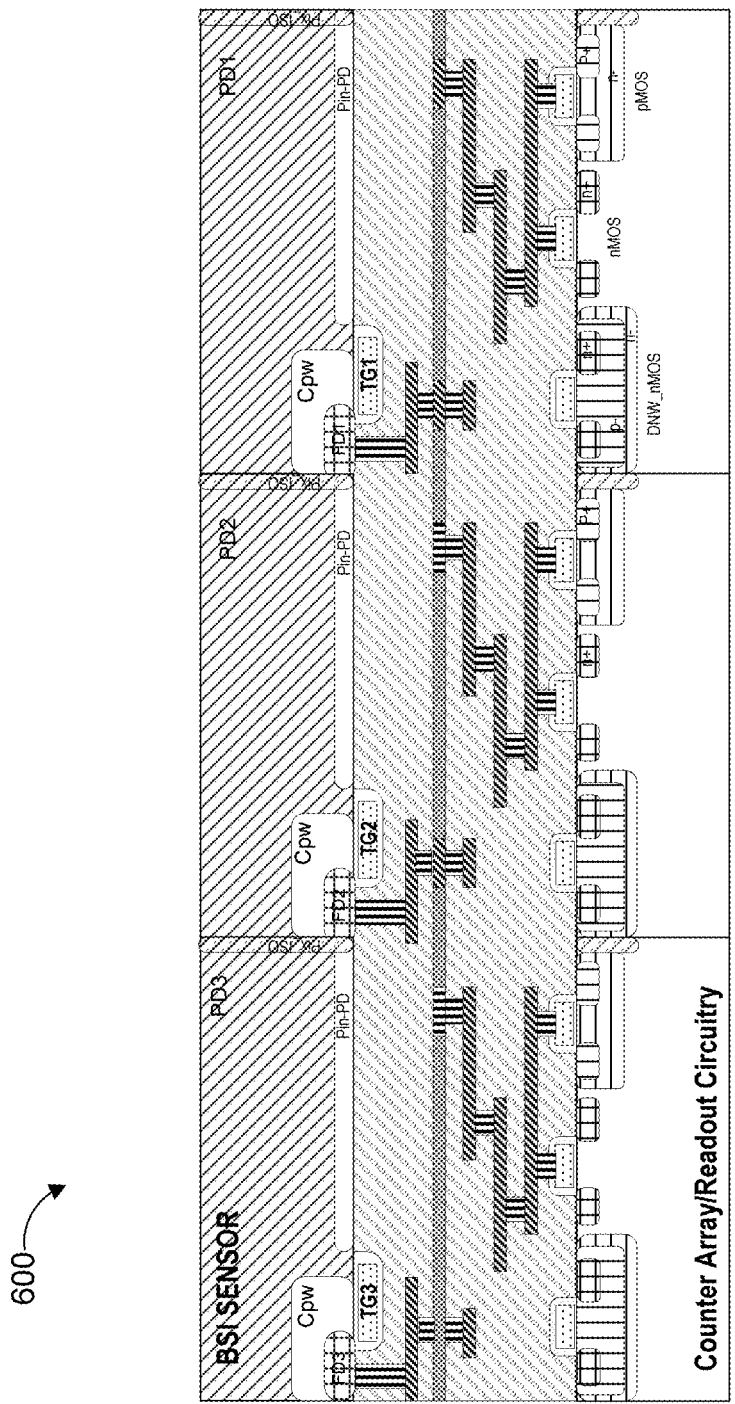
FIG. 5 illustrates a cross-sectional view of a number of pixels and counter circuits in the respective top and bottom wafers in accordance with aspects of this disclosure.

FIG. 5 illustrates a cross-sectional view 600 of a number of pixels and counter circuits in the respective top and bottom wafers 510 and 520 in accordance with aspects of this disclosure. The pixels in the image sensor are 3D stacked at the pixel level, in which the pixel size may match the counter size. In certain implementations, this requires advanced node technologies and fine hybrid bonded pitch of less than 1.0 μm. In the FIG. 4 implementation, the top wafer 510 is a backside illumination (BSI) sensor, while the bottom wafer 520 includes an array of counters, control logic, and column readout circuit blocks. According to implementations of certain wafer stacking technologies, the wafers are required to be stacked face-to-face. Accordingly, a BSI sensor array enables the wafers to be stacked face-to-face while the backside of the sensor wafer receives illumination from a scene.

There are a number of advantages to the solid state image sensor in accordance with this disclosure. A ripple counter may be implemented at each pixel readout so as to offer extended dynamic range image signal readout as discussed above, such that the photo-detectors do not reach saturation. Operation of this high dynamic range pixel may record pixel values before saturation via a pre-determined threshold value of saturation. This process may then be followed by resetting the photo-detector and allowing a subsequent repeating process of light integration and resetting, all in a single shot of frame exposure time.

The solid state image sensor in accordance with this disclosure may be realized with the advanced node CMOS Image Sensor 3D wafer stacked technologies which support fine pad pitch of hybrid bonding (less than 1.0 μm). This 3D stacked sensor implementation eases the pixel design complexity and enable small pixel high dynamic range realization with robust image blooming protection, without the loss of resolution and frame rate.

Figure 6:
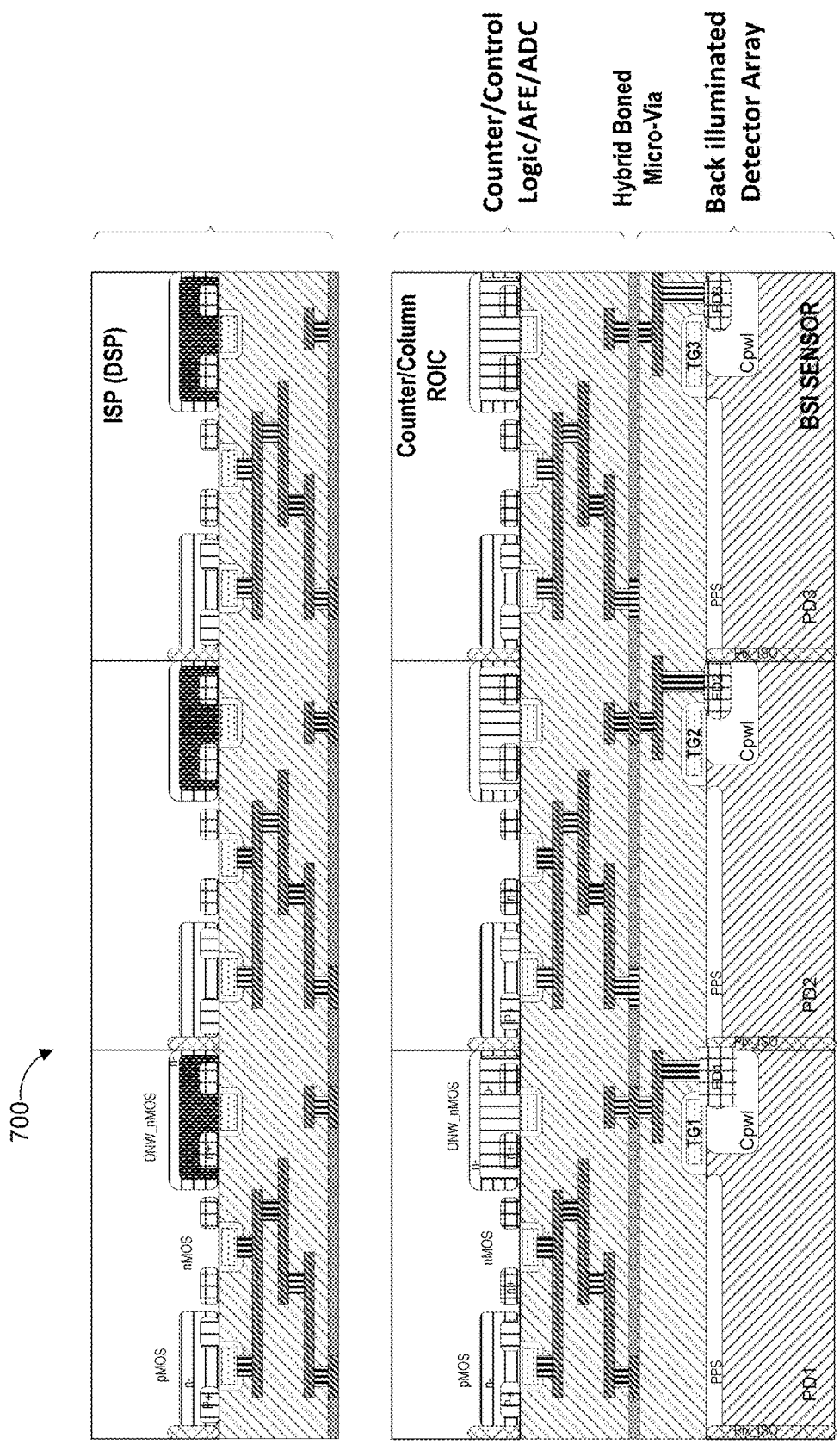
FIG. 6 illustrates another embodiment of the solid state image sensor in accordance with aspects of this disclosure.

FIGS. 6 and 7 illustrate two embodiments of the solid state image sensor in accordance with aspects of this disclosure.

In the embodiment of FIG. 6, the wafers 700 are 3D Stacked at the pixel level, in which the pixel size may match the counter size. In certain implementations, this requires advanced node technologies, and fine hybrid bonded pitch of less than 1.0 μm. The top wafer of this embodiment is a regular BSI sensor, while the bottom wafer including an array of counters, control logic, and column readout circuit blocks. In the illustration of FIG. 6, the orientation of the top and bottom wafers has been reversed with respect to the orientations illustrated in FIGS. 4 and 5. Specifically, the top wafer includes a back illuminated detector array and is hybrid bonded using micro vias to the bottom wafer. The bottom wafer includes an array of counters, control logic, analog front ends (AFEs), and ADCs.

In the embodiment of FIG. 7, the wafers 800 are 3D Stacked at the column level with matured through silicon via (TSV) bonding technologies, in which the pixel size may match the counter size. The top-tier wafer is a BSI sensor, while the bottom-tier wafer consists of an array of counters, control logic, and column readout circuit blocks. The orientation of the top and bottom wafers in FIG. 7 is reversed with respect to the orientations in illustrated in FIGS. 4 and 5. Specifically, the top wafer includes a back illuminated detector array and is hybrid bonded using micro vias to the bottom wafer. The bottom wafer includes an array of counters, control logic, analog front ends (AFEs), and ADCs. The bottom wafer is further fusion bonded to an auxiliary wafer including a digital signal processor (DSP) formed as an array corresponding to the counter array of the bottom wafer.

Example Flowchart for Operation of a Solid State Image Sensor

An exemplary implementation of this disclosure will now be described in the context of a method operable by a solid state image sensor. FIG. 8 is a flowchart illustrating an example method 900 operable by a pixel readout system 300, or component(s) thereof, for operation of a solid state image sensor in accordance with aspects of this disclosure. For example, the steps of method 900 illustrated in FIG. 8 may be performed by a pixel 440 and a readout circuit 450 of the solid state image sensor.

The method 900 begins at block 901. At block 905, the solid state image sensor increments one of a plurality of counters in response to a corresponding one of a plurality of photosensors receiving an amount of light that is greater than a photosensor threshold. The solid state image sensor may include a first wafer comprising an array of pixels, each of the pixels comprising a photosensor. The solid state image sensor may further include a second wafer comprising an array of readout circuits, each of the readout circuits comprising a counter.

At block 910, the readout circuit generates a readout signal indicative of an amount of light received by the corresponding photosensor within an exposure period. The readout signal may be based on a value stored in the corresponding counter and a remainder stored in the corresponding pixel. The method 900 ends at block 915.

Other Considerations

In some embodiments, the circuits, processes, and systems discussed above may be utilized in a wireless communication device, such as apparatus 100. The wireless communication device may be a kind of electronic device used to wirelessly communicate with other electronic devices. Examples of wireless communication devices include cellular telephones, smart phones, Personal Digital Assistants (PDAs), e-readers, gaming systems, music players, netbooks, wireless modems, laptop computers, tablet devices, etc.

The wireless communication device may include one or more image sensors, two or more image signal processors, and a memory including instructions or modules for carrying out the processes discussed above. The device may also have data, a processor loading instructions and/or data from memory, one or more communication interfaces, one or more input devices, one or more output devices such as a display device and a power source/interface. The wireless communication device may additionally include a transmitter and a receiver. The transmitter and receiver may be jointly referred to as a transceiver. The transceiver may be coupled to one or more antennas for transmitting and/or receiving wireless signals.

The wireless communication device may wirelessly connect to another electronic device (e.g., base station). A wireless communication device may alternatively be referred to as a mobile device, a mobile station, a subscriber station, a user equipment (UE), a remote station, an access terminal, a mobile terminal, a terminal, a user terminal, a subscriber unit, etc. Examples of wireless communication devices include laptop or desktop computers, cellular phones, smart phones, wireless modems, e-readers, tablet devices, gaming systems, etc. Wireless communication devices may operate in accordance with one or more industry standards such as the 3rd Generation Partnership Project (3GPP). Thus, the general term "wireless communication device" may include wireless communication devices described with varying nomenclatures according to industry standards (e.g., access terminal, user equipment (UE), remote terminal, etc.).

The functions described herein may be stored as one or more instructions on a processor-readable or computer-readable medium. The term "computer-readable medium" refers to any available medium that can be accessed by a computer or processor. By way of example, and not limitation, such a medium may include random-access memory (RAM), read-only memory (ROM), electrically erasable programmable read-only memory (EEPROM), flash memory or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The methods disclosed herein include one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It should be noted that the terms "couple," "coupling," "coupled" or other variations of the word couple as used herein may indicate either an indirect connection or a direct connection. For example, if a first component is "coupled" to a second component, the first component may be either indirectly connected to the second component or directly connected to the second component. As used herein, the term "plurality" denotes two or more. For example, a plurality of components indicates two or more components.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

In the foregoing description, specific details are given to provide a thorough understanding of the examples. However, it will be understood by one of ordinary skill in the art that the examples may be practiced without these specific details. For example, electrical components/devices may be shown in block diagrams in order not to obscure the examples in unnecessary detail. In other instances, such components, other structures and techniques may be shown in detail to further explain the examples.

Headings are included herein for reference and to aid in locating various sections. These headings are not intended to limit the scope of the concepts described with respect thereto. Such concepts may have applicability throughout the entire specification.

It is also noted that the examples may be described as a process, which is depicted as a flowchart, a flow diagram, a finite state diagram, a structure diagram, or a block diagram. Although a flowchart may describe the operations as a sequential process, many of the operations can be performed in parallel, or concurrently, and the process can be repeated. In addition, the order of the operations may be re-arranged. A process is terminated when its operations are completed. A process may correspond to a method, a function, a procedure, a subroutine, a subprogram, etc. When a process corresponds to a software function, its termination corresponds to a return of the function to the calling function or the main function.

The previous description of the disclosed implementations is provided to enable any person skilled in the art to make or use the present disclosure. Various modifications to these implementations will be readily apparent to those skilled in the art, and the generic principles defined herein may be applied to other implementations without departing from the spirit or scope of the disclosure. Thus, the present disclosure is not intended to be limited to the implementations shown herein but is to be accorded the widest scope consistent with the principles and novel features disclosed herein.

What is claimed is:

1. A solid state image sensor, comprising:
   an array of pixels arranged over a first wafer of a 3-D stack, each of the pixels comprising a photosensor configured to output a first value indicative of an amount of light received by the corresponding photosensor; and an array of readout circuits arranged over a second wafer of the 3-D stack, wherein each of the readout circuits is configured to output a readout signal indicative of an amount of light received by a corresponding one of the pixels, and wherein each readout circuit comprises:

a comparator configured to:
receive the first value from a corresponding one of the pixels;
compare the received first value to a photosensor threshold; and
output a second value indicative of the first value being greater than the photosensor threshold;

a counter configured to:
receive the second value from a corresponding one of the comparators; and
increment in response to received clock cycles until the received second value indicates the first value is greater than the photosensor threshold; and a latch configured to receive and store a value associated with the corresponding counter, and wherein each of the readout circuits is configured to generate the readout signal based on the stored value associated with the corresponding counter and a remainder associated with the corresponding pixel.

2. The solid state image sensor of claim 1, wherein each of the pixels is configured to be reset in response to receiving an amount of light that is greater than the photosensor threshold.

3. The solid state image sensor of claim 1, wherein each of the counters and each of the pixels is configured to be reset at the end of an exposure period, and each of the readout circuits is configured to generate, at the end of the exposure period, the readout signal as a digital value having most significant bits based on the value associated with the corresponding counter, and least significant bits based on the remainder associated with the corresponding pixel.

4. The solid state image sensor of claim 3, wherein the least significant bits and the most significant bits are respectively read from the pixel and the readout circuit simultaneously.

5. The solid state image sensor of claim 1, wherein each of the photosensors is a backside illumination (BSI) sensor.

6. The solid state image sensor of claim 1, wherein each of the pixels is configured to be reset a plurality of times within an exposure period.

7. The solid state image sensor of claim 1, wherein the readout signal is configured to be read from each of the readout circuits once for each of a plurality of exposure periods.

8. The solid state image sensor of claim 1, wherein the readout circuits correspond one-to-one with the pixels.

9. The solid state image sensor of claim 1, wherein:
the first and second wafers are bonded with a pitch of less than 1 pm.

10. The solid state image sensor of claim 1, wherein each readout circuit is configured to receive the first value from a corresponding one of the pixels by a corresponding through silicon via.

11. The solid state image sensor of claim 1, further comprising a timing generator configured to select a pixel from the array of pixels.

12. A method performed by a solid state image sensor comprising an array of pixels arranged over a first wafer of a 3-D stack, each of the pixels comprising a photosensor configured to output a first value indicative of an amount of light received by the corresponding photosensor, and an array of readout circuits arranged over a second wafer of the 3-D stack, each of the readout circuits comprising a comparator, a latch, and a counter, electrically connected to the array of pixels, and configured to output a readout signal indicative of an amount of light received by a corresponding one of the pixels, the method comprising:

receiving, via the comparator of one of the readout circuits, the first value from a corresponding one of the pixels;
comparing, via the comparator of the one of the readout circuits, a first value from a photosensor of a corresponding one of the pixels to a photosensor threshold;
outputting, via the comparator of the one of the readout circuits, a second value indicative of the first value being greater than the photosensor threshold;
incrementing the counter of the one of the readout circuits in response to received clock cycles until the second value indicates the first value is greater than the photosensor threshold;
receiving and storing, via the latch, a value associated with the counter of the one of the readout circuits; and
generating, via the one of the readout circuits, the readout signal based on the stored value associated with the corresponding counter and a remainder associated with the corresponding pixel.

13. The method of claim 12, further comprising resetting the corresponding pixel in response to the corresponding photosensor receiving an amount of light that is greater than the photosensor threshold.

14. The method of claim 12, further comprising:
resetting each of the counters and each of the pixels at the end of an exposure period; and
generating, via the readout circuit and at the end of an exposure period, the readout signal as a digital value having most significant bits based on the value associated with the corresponding counter, and least significant bits based on the remainder associated with the corresponding pixel.

15. The method of claim 14, further comprising respectively reading the least significant bits and the most significant bits from the corresponding pixel and the readout circuit simultaneously.

16. The method of claim 12, wherein each of the photosensors is a backside illumination (BSI) sensor.

17. The method of claim 12, further comprising resetting the corresponding pixel a plurality of times within an exposure period.

18. The method of claim 12, further comprising reading out the readout signal from the readout circuit once for each of a plurality of exposure periods.

19. The method of claim 12, wherein the readout circuits correspond one-to-one with the pixels.

20. The method of claim 12, wherein:
the first and second wafers are bonded with a pitch of less than 1 pm.

21. The method of claim 12, further comprising receiving, via the one of the readout circuits, the first value by a respective through silicon via.

22. The method of claim 12, further comprising selecting, via a timing generator, a pixel of the array of pixels.

23. A non-transitory computer readable storage medium having stored thereon instructions that, when executed by a processor of a device including an array of pixels arranged over a first wafer in a 3-D stack, each of the pixels comprising a photosensor configured to output a first value indicative of an amount of light received by the corresponding photosensor, and an array of readout circuits arranged over a second wafer of the 3-D stack, each of the plurality of readout circuits comprising a comparator, a latch, and a counter, and configured to output a readout signal indicative of an amount of light received by a corresponding one of the pixels, cause the device to:

receive, via the comparator of one of the plurality of readout circuits, the first value from a corresponding one of the pixels;

compare, via the comparator of the one of the plurality of readout circuits, the first value from a corresponding one of the pixels to a photosensor threshold;

output, via the comparator of the one of the plurality of readout circuits, a second value indicative of the first value being greater than the photosensor threshold;

increment the counter of the one of the plurality of readout circuits in response to received clock cycles until the second value indicates the first value is greater than the photosensor threshold;

receive and store, via the latch, a value associated with the counter of the one of the plurality of readout circuits; and generate, via the one of the readout circuits, the readout signal based on the value associated with the corresponding counter and a remainder associated with a corresponding one of the photosensors.

24. The non-transitory computer readable storage medium of claim 23, further having stored thereon instructions that, when executed by the processor, cause the device to reset the corresponding photosensor in response to receiving an amount of light that is greater than the photosensor threshold.

25. The non-transitory computer readable storage medium of claim 23, further having stored thereon instructions that, when executed by the processor, cause the device to:

reset each of the counters and each of the photosensors at the end of an exposure period; and generate, a readout signal at the end of the exposure period, the readout signal as a digital value having most significant bits based on the value associated with the corresponding counter, and least significant bits based on the remainder associated with a corresponding photosensor.

26. The non-transitory computer readable storage medium of claim 25, further having stored thereon instructions that, when executed by the processor, cause the device to read the least significant bits and the most significant bits from the corresponding photosensor and the corresponding counter simultaneously.

27. The non-transitory computer readable storage medium of claim 23, wherein each of the photosensors is a backside illumination (BSI) sensor.

28. The non-transitory computer readable storage medium of claim 23, further having stored thereon instructions that, when executed by the processor, cause the device to reset the corresponding photosensor a plurality of times within an exposure period.

29. The non-transitory computer readable storage medium of claim 23, further having stored thereon instructions that, when executed by the processor, cause the device to receive the first value from a corresponding one of the pixels by a corresponding through silicon via.

30. The non-transitory computer readable storage medium of claim 23, further having stored thereon instructions that, when executed by the processor, cause the device to select, via a timing generator, a pixel of the array of pixels.

* * * * *